(12) United States Patent
Wang

(10) Patent No.: US 9,159,447 B2
(45) Date of Patent: Oct. 13, 2015

(54) SHIFT REGISTER UNIT, SHIFT REGISTER, ARRAY SUBSTRATE AND DISPLAY APPARATUS

(71) Applicant: BOE TECHNOLOGY GROUP CO., LTD., Beijing (CN)

(72) Inventor: Ying Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1 day.

(21) Appl. No.: 14/350,466

(22) PCT Filed: Apr. 3, 2013

(86) PCT No.: PCT/CN2013/073704
§ 371 (c)(1),
(2) Date: Apr. 8, 2014

(87) PCT Pub. No.: WO2014/117433
PCT Pub. Date: Aug. 7, 2014

(65) Prior Publication Data
US 2015/0043705 A1 Feb. 12, 2015

(30) Foreign Application Priority Data

Feb. 1, 2013 (CN) .......................... 2013 1 0041454

(51) Int. Cl.
*G11C 19/00* (2006.01)
*G11C 19/18* (2006.01)
*G11C 19/28* (2006.01)
*G09G 3/36* (2006.01)

(52) U.S. Cl.
CPC ............ *G11C 19/184* (2013.01); *G09G 3/3648* (2013.01); *G09G 3/3677* (2013.01); *G11C 19/28* (2013.01); *G09G 3/3611* (2013.01); *G09G 2310/0286* (2013.01); *G11C 19/287* (2013.01)

(58) Field of Classification Search
None
See application file for complete search history.

(56) References Cited

U.S. PATENT DOCUMENTS

| 8,446,177 | B2 * | 5/2013 | Yamamoto et al. ............ 326/112 |
| 9,042,509 | B2 * | 5/2015 | Yu et al. ............................ 377/64 |
| 2008/0101529 | A1 * | 5/2008 | Tobita ................................ 377/64 |
| 2010/0289535 | A1 * | 11/2010 | Chen et al. ..................... 327/109 |
| 2011/0134107 | A1 * | 6/2011 | Lebrun et al. .................. 345/213 |
| 2014/0064438 | A1 * | 3/2014 | Wu et al. ........................... 377/64 |
| 2015/0043704 | A1 * | 2/2015 | Ma ..................................... 377/68 |
| 2015/0131771 | A1 * | 5/2015 | Hu et al. ................. G11C 19/28 |

FOREIGN PATENT DOCUMENTS

| CN | 102831861 A | 12/2012 |
| CN | 203055466 A | 7/2013 |
| CN | 203055466 U | 7/2013 |

OTHER PUBLICATIONS

Written Opinion of the International Searching Authority dated Oct. 31, 2013; PCT/CN2013/073704.
International Search Report mailed Nov. 7, 2013; PCT/CN2013/073704.

* cited by examiner

Primary Examiner — Tuan T Lam
(74) Attorney, Agent, or Firm — Ladas & Parry LLP

(57) ABSTRACT

The present disclosure relates to a field of display. Particularly, embodiments of the present invention disclose a shift register unit, a shift register, an array substrate and a display apparatus that enable the respective shift register units to be reset independently. The shift register unit includes a sampling part, an output part and a reset part, wherein the sampling part includes a first switching transistor and a second switching transistor, the output part includes a fifth switching transistor, a sixth switching transistor, a first capacitor and a second capacitor, and the reset part includes a third switching transistor and a fourth transistor.

15 Claims, 3 Drawing Sheets

SHIFT REGISTER UNIT, SHIFT REGISTER, ARRAY SUBSTRATE AND DISPLAY APPARATUS

TECHNICAL FIELD

The present invention relates to a field of display, and more particularly, to a shift register unit, a shift register, an array substrate and a display apparatus.

BACKGROUND

With continuous development of display technology, an active array display utilizing thin film transistors has become a most common flat panel display apparatus whose gate driving circuit is realized by means of a shift register. The shift register comprises a plurality of shift register units connected in cascade, and the respective shift register units output signals in sequence to realize progressive driving of the gates.

The existing shift register unit includes three operational states of sampling, output and reset. In two shift register units adjacent to each other, an output signal of a following shift register unit serves as a reset signal of a previous shift register unit to stop the previous shift register unit from outputting. However, if the previous shift register unit fails to receive the reset signal from the following shift register unit, the previous shift register unit will not stop outputting. Therefore, in the prior art, the reset of the previous shift register unit is controlled by the following shift register unit, and if the reset signal from the following shift register unit fails to be fed back or is delayed to be fed back to the previous shift register unit, the previous shift register unit will not be stopped from outputting at a predetermined timing, which may cause the whole array substrate and even the liquid crystal display to be unable to operate properly. Thus, it is essential to solve a problem in which the shift register unit fails to be reset independently.

SUMMARY

The technical problem that the embodiments of the present invention is to solve is to provide a shift register unit, a shift register, an array substrate and a display apparatus which enable the respective shift register units to be reset independently.

To solve the above technical problem, embodiments of the present invention employ technical solutions as follows.

A first aspect of embodiment of the present invention provides a shift register unit comprising a sampling part, an output part and a reset part, wherein the sampling part includes a first switching transistor and a second switching transistor, the output part includes a fifth switching transistor, a sixth switching transistor, a first capacitor and a second capacitor, and the reset part includes a third switching transistor and a fourth switching transistor; the source of the first switching transistor is connected to an input terminal of the shift register unit and receives an input signal from the input terminal, and the gate of the first switching transistor receives a first clock signal; the gate and the source of the second switching transistor receive a second clock signal whose phase is inverted to that of the first clock signal; the gate and the source of the third switching transistor receive the first clock signal; the gate of the fourth switching transistor receives the second clock signal, and the source of the fourth switching transistor receives the power supply input signal; the source of the fifth switching transistor receives the second clock signal, the gate of the fifth switching transistor is connected to the drains of the first switching transistor and the second switching transistor, and the drain of the fifth switching transistor is connected to the output terminal of the shift register unit; the gate of the sixth switching transistor is connected to the drains of the third switching transistor and the fourth switching transistor, the source of the sixth switching transistor receives the power supply input signal, and the drain of the sixth switching transistor is connected to the output terminal of the shift register unit; one terminal of the first capacitor is connected to the gate of the fifth switching transistor, and the other terminal thereof is connected to the output terminal of the shift register unit; and one terminal of the second capacitor is connected to the gate of the sixth switching transistor, and the other terminal thereof receives the power supply input signal.

According to an embodiment, each of the first to the sixth switching transistors is a MOS transistor or a thin film transistor.

According to an embodiment, the thin film transistor is a thin film transistor of P type or a thin film transistor of N type.

According to an embodiment, the power supply input signal is at a high level in a case in which each of the first to the sixth switching transistors is the thin film transistor of P type; in a first time period, when the input signal is at the low level, the first clock signal is at the low level and the second clock signal is at the high level, the output signal of the shift register unit is at the high level; in a second time period, when the input signal is at the high level, the first clock signal is at the high level and the second clock signal is at the low level, the output signal of the shift register unit is at the low level; and in a third time period, when the input signal is at the high level, the first clock signal is at the low level and the second clock signal is at the high level, the output signal of the shift register unit is at the high level.

According to an embodiment, the power supply input signal is at the low level in a case in which each of the first to the sixth switching transistors is the thin film transistor of N type; in a first time period, when the input signal is at the high level, the first clock signal is at the high level and the second clock signal is at the low level, the output signal of the shift register unit is at the low level; in a second time period, when the input signal is at the low level, the first clock signal is at the low level and the second clock signal is at the high level, the output signal of the shift register unit is at the high level; and in a third time period, the input signal is at the low level, the first clock signal is at the high level and the second clock signal is at the low level, the output signal of the shift register unit is at the low level.

A second aspect of embodiment of the present invention provides a shift register comprising n shift register units as described above connected in cascade, the n being an integer greater than 1, wherein an input terminal of the first shift register unit is connected to a signal input terminal of the shift register, and an output terminal of the nth shift register unit is connected to a signal output terminal of the shift register.

A third aspect of embodiment of the present invention provides an array substrate comprising the above shift register.

A fourth aspect of embodiment of the present invention provides a display apparatus comprising the above array substrate.

In the embodiments of the present invention, the structure of the shift register unit enables the shift register unit to output a corresponding output signal after the input signal is received, and to be automatically reset after the output signal is output, without waiting for the output signal of the following shift register unit as the reset signal and being reset in turn in accordance with the reset signal. The normal operation of the shift register unit is ensured, and then the normal operation of the entire array substrate and even that of the liquid crystal display are ensured.

BRIEF DESCRIPTION OF THE DRAWINGS

To explain the technical solutions of embodiments of the present invention or the prior art more clearly, the appended drawings that need to be utilized in the description of the embodiments will be briefly introduced hereinafter. Obviously, the appended drawings in the following description are only some embodiments of the present invention, and for those skilled in the art, other drawings can also be obtained in accordance with these appended drawings without paying any inventive work.

DETAILED DESCRIPTION OF THE EMBODIMENTS

Hereinafter, the technical solutions of embodiments of the present invention will be clearly and fully described in conjunction with the appended drawings of the embodiments of the present invention; obviously, the described embodiments are only a part of the embodiments of the present invention, rather than all of the embodiments. Based on the embodiments of the present invention, all the other embodiments acquired by those skilled in art without paying any inventive work are within the protection scope of the present invention.

Figure 1:
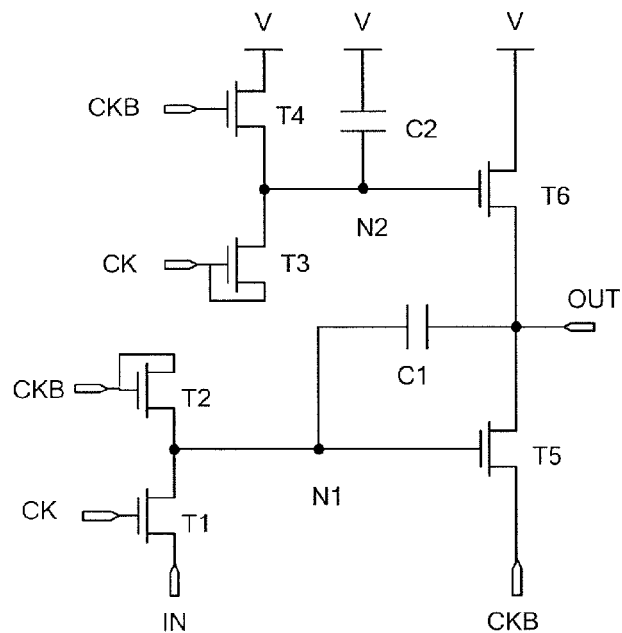
FIG. 1 is a schematic diagram of a structure of a shift register unit according to an embodiment of the present invention.
Figure 2:
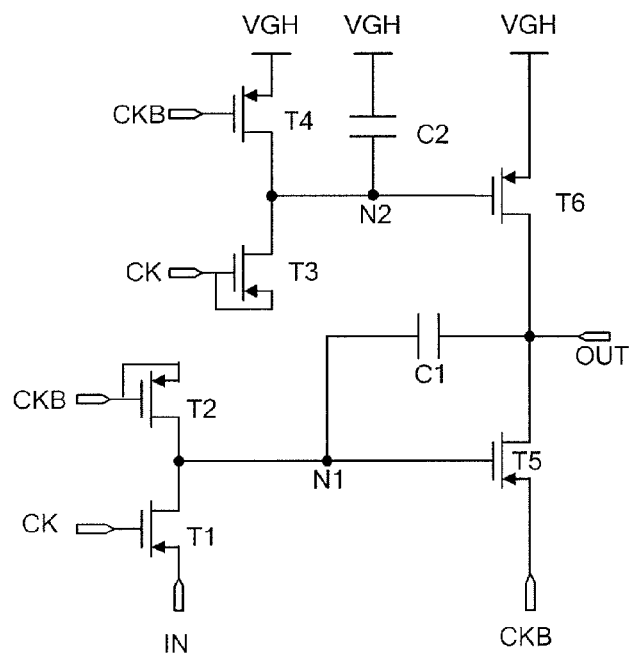
FIG. 2 is a schematic diagram of a structure of a shift register unit formed by P type thin film transistors according to an embodiment of the present invention.

A first aspect of an embodiment of the present invention provides a shift register unit. For convenience of description of the shift register unit, as shown in FIG. 1, the shift register unit includes a sampling part, an output part and a reset part. Here, the sampling part includes a first switching transistor T1 and a second switching transistor T2; the output part includes a fifth switching transistor T5, a sixth switching transistor T6, a first capacitor C1 and a second capacitor C2; and the reset part includes a third switching transistor T3 and a fourth switching transistor T4; particularly, the source of the first switching transistor T1 is connected to an input terminal of the shift register unit, and receives an input signal IN from the input terminal; the gate of the first switching transistor T1 receives a first clock signal CK; the gate and the source of the second switching transistor T2 receive a second clock signal CKB whose phase is inverted to that of the first clock signal CK; the gate and the source of the third switching transistor T3 receive the first clock signal CK; the gate of the fourth switching transistor T4 receives the second clock signal CKB, and the source of the fourth switching transistor T4 receives the power supply input signal V; the source of the fifth switching transistor T5 receives the second clock signal CKB, the gate of the fifth switching transistor T5 is connected to the drains of the first switching transistor T1 and the second switching transistor T2, and the drain of the fifth switching transistor T5 is connected to output terminal of the shift register unit; the gate of the sixth switching transistor T6 is connected to the drains of the third switching transistor T3 and the fourth switching transistor T4, the source of the sixth switching transistor T6 receives the power supply input signal V, and the drain of the sixth switching transistor T6 is connected to the output terminal of the shift register unit; one terminal of the first capacitor C1 is connected to the gate of the fifth switching transistor T5, and the other terminal thereof is connected to the output terminal of the shift register unit; one terminal of the second capacitor C2 is connected to the gate of the sixth switching transistor T6, and the other terminal thereof receives the power supply input signal V.

In the technical solution of the present embodiment, the structure of the shift register unit enables the shift register unit to output a corresponding output signal after the input signal is received, and to be automatically reset after the output signal is output, rather than wait for the output signal of the following shift register unit as the reset signal and is reset in turn in accordance with the reset signal. The normal operation of the shift register unit is ensured, and then the normal operation of the entire array substrate and even that of the liquid crystal display are ensured.

It should be explained that, in the embodiments of the present invention, the high level is represented with VGH, and the low level is represented with VGL.

Optionally, each of the first to the sixth switching transistors can be a MOS transistor or a thin film transistor. Further, the thin film transistor can be a thin film transistor of P type or a thin film transistor of N type; the poly-silicon thin film transistor is especially suitable for the shift register unit since the mobility of the poly-silicon thin film transistor is relatively high.

Figure 3:
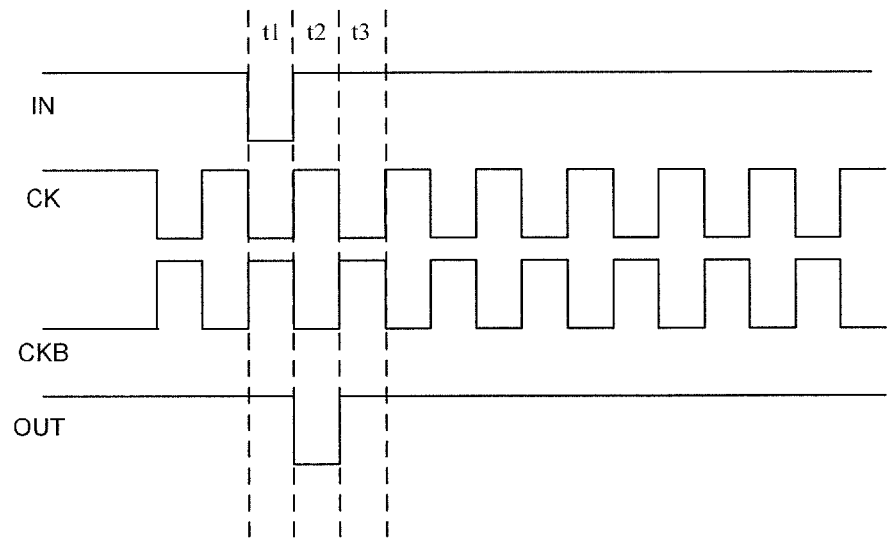
FIG. 3 is a timing chart of the shift register unit formed by P type thin film transistors according to the embodiment of the present invention.

As shown in FIG. 3, in a case in which each of the first to the sixth switching transistors is the thin film transistor of P type, during a first time period t1, the input signal IN is at a low level VGL, the first clock signal CK is at the low level VGL and the second clock signal CKB is at the high level VGH, the output signal OUT of the shift register unit is at the high level VGH.

Particularly, in the first time period t1, the shift register unit enters into the sampling phase.

At this timing, the input signal IN is at the low level VGL, and the first clock signal CK is at the low level VGL, so that the first and third switching transistors T1 and T3 are turned on; at the same time, since the second clock signal CKB and the first clock signal CK are inverted to each other, the second clock signal CKB is at the VGH, and the second switching transistor T2 and the fourth switching transistor T4 fail to be turned on. Therefore, at this timing, the levels at points of N1 and N2 are accordingly pulled down to a low level (VGL+Vth), Vth representing threshold voltage of any of the thin film transistors, and thus the sixth switching transistor T6 is turned on. Since the source of the sixth switching transistor T6 receives the high level VGH and the drain thereof is connected to the output terminal of the shift register unit, the output signal OUT of the shift register unit is at the high level VGH.

Since the level at the N1 point is at the low level (VGL+Vth), the output terminal of the sixth switching transistor T6 outputs the high level VGH; at this timing, the first capacitor C1 which is located between the N1 point and the output terminal of the sixth switching transistor T6 is charged to charge the input signal IN, and then a voltage difference across the first capacitor C1 is (VGH−VGL−Vth), VGH representing the high level, VGL representing the low level, and Vth representing the threshold voltage.

In the second time period t2, the input signal is at the high level VGH, the first clock signal CK is at the high level VGH and the second clock signal CKB is at the low level VGL, the output signal of the shift register unit is at the low level VGL.

Particularly, in the second time period t2, the shift register unit enters the output phase.

At this timing, both of the input signal IN and the first clock signal CK are at the high level VGH, so that the first switching transistor T1 is turned off; due to effect of the first capacitor C1, the level at the N1 point is maintained as it is, which is still (VGL+Vth), and thus the T5 is turned on and the low level signal VGL is output. At the same time, since the second clock signal CKB is at the low level VGL, the second and the fourth switching transistor T2 and T4 are turned on; since the source of the fourth switching transistor T4 receives the high level VGH, at this timing, the level at the N2 point is at the high level VGH, and the sixth switching transistor T6 is turned off. At this timing, the output signal of the shift register unit is the signal at the low level VGL outputted from the fifth switching transistor T5.

In the third time period t3, the input signal IN is at the high level VGH, the first clock signal CK is at the low level VGL and the second clock signal CKB is at the high level VGH, the output signal of the shift register unit is at the high level VGH.

Particularly, in the third time period t3, the shift register unit enters the reset phase.

At this timing, the first clock signal CK is at the low level VGL, the input signal IN is at the high level VGH and the first switching transistor T1 is turned on, so that the level at the N1 point is pulled up to the high level VGH and the fifth switching transistor is turned off. At the same time, since the first clock signal CK is at the low level VGL, the third switching transistor T3 is turned on and the potential at N2 is pulled down to (VGL+Vth), so that the sixth switching transistor T6 is turned on and the output signal OUT of the shift register unit is pulled up to the high level VGH again, and thus the reset of the shift register unit is realized independently.

In addition, in other periods of the shift register unit, the second capacitor C2 maintains the N2 point to be at the low level VGL, which ensures the sixth switching transistor T6 to be turned on, so that the output signal OUT is at the high level VGH all the time and the stability of the output signal OUT is improved.

Figure 4:
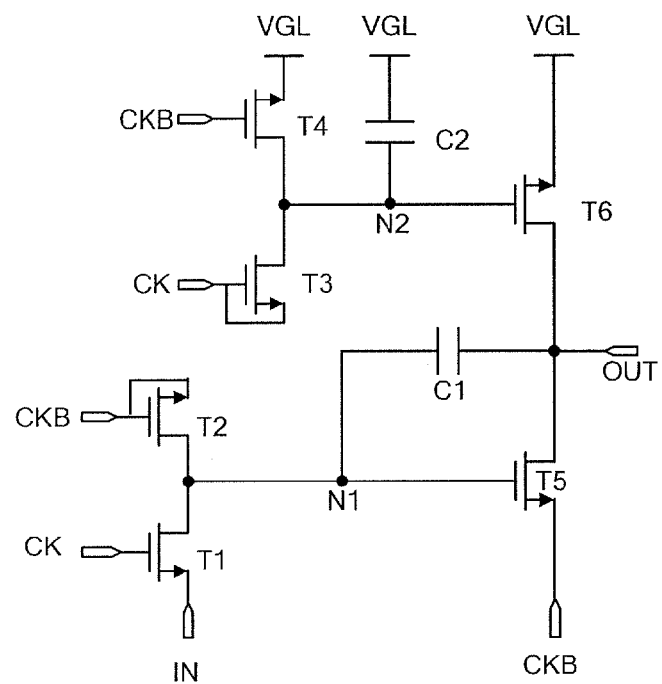
FIG. 4 is a schematic diagram of a structure of a shift register unit formed by N type thin film transistors according to an embodiment of the present invention.

As show in FIG. 4, when each of the first to the sixth switching transistors is the thin film transistor of N type, the shift register unit can also realize the independent reset function; at this time, the power supply input signal V is at the low level VGL, and since the operation procedure of the shift register unit formed by the thin film transistors of N type is similar to that of shift register unit formed by the thin film transistors of P type, repeated description will not be further made herein.

Figure 5:
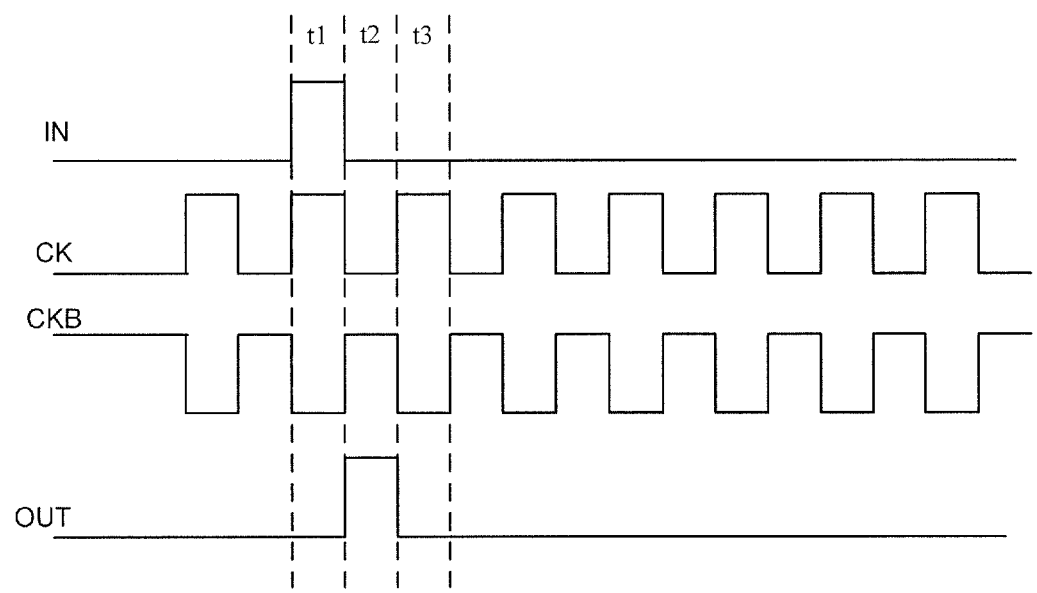
FIG. 5 is a timing chart of the shift register unit formed by N type thin film transistors according to the embodiment of the present invention.

It should be explained that, each of the input signal IN, the first clock signal CK, the second clock signal CKB and the output signal OUT of the shift register unit formed by the thin film transistors of N type is inverted to that of the shift register unit formed by the thin film transistors of P type, and details can be referred to FIG. 5.

In addition, generally, the source and the drain of the thin film transistor can be exchanged.

The second aspect of the present embodiment provides a shift register comprising n shift register units as described above connected in cascade, the n being an integer greater than 1, wherein an input terminal of the first shift register unit is connected to a signal input terminal of the shift register, and an output of the nth shift register unit is connected to a signal output terminal of the shift register.

Since the shift register provided in this embodiment of the invention comprises the technical features of the shift register unit provided in the above embodiment of the invention, the same technical effect can be generated and same technical problem can be solved.

A third aspect of this invention provides an array substrate comprising the above shift register.

A fourth aspect of this invention provides a display apparatus comprising the above array substrate. The liquid crystal display can be any products or means with a display function such as a liquid crystal panel, electronic paper, OLED panel, mobile phone, tablet computer, TV, display, laptop computer, digital photo frame, navigator and the like, especially active organic light emitting diode display which employs low temperature poly-silicon technology.

The above descriptions are only specific embodiments of the invention, and the protection scope of the invention is not limited thereto. Modification or alternation that can be easily figured out by any one skilled in the art within the technical range disclosed in the present application should be involved in the protection scope of the present invention. Therefore, the protection scope of the present disclosure should be defined by the protection scope of the claims.

What is claimed is:

1. A shift register unit comprising a sampling part, an output part and a reset part, wherein the sampling part includes a first switching transistor and a second switching transistor, the output part includes a fifth switching transistor, a sixth switching transistor, a first capacitor and a second capacitor, and the reset part includes a third switching transistor and a fourth switching transistor;

a source of the first switching transistor is connected to an input terminal of the shift register unit and is configured to receive an input signal from the input terminal, and the gate of the first switching transistor is configured to receive a first clock signal;

a gate and a source of the second switching transistor are configured to receive a second clock signal whose phase is inverted to that of the first clock signal;

a gate and a source of the third switching transistor are configured to receive the first clock signal;

a gate of the fourth switching transistor is configured to receive the second clock signal, and a source of the fourth switching transistor is configured to receive a power supply input signal;

a source of the fifth switching transistor is configured to receive the second clock signal, a gate of the fifth switching transistor is connected to a drain of the first switching transistor and a drain of the second switching transistor, and a drain of the fifth switching transistor is connected to the output terminal of the shift register unit;

a gate of the sixth switching transistor is connected to drains of the third switching transistor and the fourth switching transistor, a source of the sixth switching transistor is configured to receive the power supply input signal, and a drain of the sixth switching transistor is connected to the output terminal of the shift register unit;

one terminal of the first capacitor is connected to the gate of the fifth switching transistor, and the other terminal of the first capacitor is connected to the output terminal of the shift register unit; and one terminal of the second capacitor is connected to the gate of the sixth switching transistor, and the other terminal of the second capacitor is configured to receive the power supply input signal.

2. The shift register unit according to claim 1, wherein each of the first to the sixth switching transistors is a MOS transistor or a thin film transistor.

3. The shift register unit according to claim 2, wherein the thin film transistor is a thin film transistor of P type or a thin film transistor of N type.

4. The shift register unit according to claim 3, wherein the power supply input signal is at a high level when each of the first to the sixth switching transistors is the thin film transistor of P type;
   in a first time period, when the input signal is at a low level, the first clock signal is at a low level and the second clock signal is at a high level, a signal output from the shift register unit is at a high level;
   in a second time period, when the input signal is at a high level, the first clock signal is at a high level and the second clock signal is at a low level, the signal output from the shift register unit is at a low level; and
   in a third time period, when the input signal is at the high level, the first clock signal is at the low level and the second clock signal is at the high level, the signal output from the shift register unit is at the high level.

5. The shift register unit according to claim 3, wherein the power supply input signal is at a low level when each of the first to the sixth switching transistors is the thin film transistor of N type;
   in a first time period, when the input signal is at a high level, the first clock signal is at a high level and the second clock signal is at a low level, a signal output from the shift register unit is at a low level;
   in a second time period, when the input signal is at a low level, the first clock signal is at a low level and the second clock signal is at a high level, the signal output from the shift register unit is at a high level; and
   in a third time period, when the input signal is at the low level, the first clock signal is at the high level and the second clock signal is at the low level, the signal output from the shift register unit is at the low level.

6. A shift register comprising n shift register units according to claim 1 connected in cascade, the n being an integer greater than 1, wherein an input terminal of a first shift register unit is connected to a signal input terminal of the shift register, and an output terminal of an nth shift register unit is connected to a signal output terminal of the shift register.

7. The shift register according to claim 6, wherein each of the first to the sixth switching transistors is a MOS transistor or a thin film transistor.

8. The shift register according to claim 7, wherein the thin film transistor is a thin film transistor of P type or a thin film transistor of N type.

9. The shift register according to claim 8, wherein the power supply input signal is at a high level when each of the first to the sixth switching transistors is the thin film transistor of P type;
   in a first time period, when the input signal is at a low level, the first clock signal is at a low level and the second clock signal is at a high level, a signal output from the shift register unit is at a high level;
   in a second time period, when the input signal is at a high level, the first clock signal is at a high level and the second clock signal is at a low level, the signal output from the shift register unit is at a low level; and
   in a third time period, when the input signal is at the high level, the first clock signal is at the low level and the second clock signal is at the high level, the signal output from the shift register unit is at the high level.

10. The shift register according to claim 8, wherein the power supply input signal is at a low level when each of the first to the sixth switching transistors is the thin film transistor of N type;
    in a first time period, when the input signal is at a high level, the first clock signal is at a high level and the second clock signal is at a low level, a signal output from the shift register unit is at a low level;
    in a second time period, when the input signal is at a low level, the first clock signal is at a low level and the second clock signal is at a high level, the signal output from the shift register unit is at a high level; and
    in a third time period, when the input signal is at the low level, the first clock signal is at the high level and the second clock signal is at the low level, the signal output from the shift register unit is at the low level.

11. An array substrate comprising the shift register according to claim 6.

12. The array substrate according to claim 11, wherein each of the first to the sixth switching transistors is a MOS transistor or a thin film transistor.

13. The array substrate according to claim 12, wherein the thin film transistor is a thin film transistor of P type or a thin film transistor of N type.

14. The array substrate according to claim 13, wherein the power supply input signal is at a high level when each of the first to the sixth switching transistors is the thin film transistor of P type;
    in a first time period, when the input signal is at a low level, the first clock signal is at a low level and the second clock signal is at a high level, a signal output from the shift register unit is at a high level;
    in a second time period, when the input signal is at a high level, the first clock signal is at a high level and the second clock signal is at a low level, the signal output from the shift register unit is at a low level; and
    in a third time period, when the input signal is at the high level, the first clock signal is at the low level and the second clock signal is at the high level, the signal output from the shift register unit is at the high level.

15. The array substrate according to claim 13, wherein the power supply input signal is at a low level when each of the first to the sixth switching transistors is the thin film transistor of N type;
    in a first time period, when the input signal is at a high level, the first clock signal is at a high level and the second clock signal is at a low level, a signal output from the shift register unit is at a low level;
    in a second time period, when the input signal is at a low level, the first clock signal is at a low level and the second clock signal is at a high level, the signal output from the shift register unit is at a high level; and
    in a third time period, when the input signal is at the low level, the first clock signal is at the high level and the second clock signal is at the low level, the signal output from the shift register unit is at the low level.

* * * * *